United States Patent [19]

Holm et al.

[11] Patent Number: 5,483,085
[45] Date of Patent: Jan. 9, 1996

[54] ELECTRO-OPTIC INTEGRATED CIRCUIT WITH DIODE DECODER

[75] Inventors: Paige M. Holm, Phoenix; George W. Rhyne, Scottsdale, both of Ariz.; Thomas J. Walczak, Woodstock, Ill.

[73] Assignee: Motorola, Schaumburg, Ill.

[21] Appl. No.: 239,626

[22] Filed: May 9, 1994

[51] Int. Cl.$^6$ .................................................. H01L 33/00
[52] U.S. Cl. .......................... 257/88; 257/89; 257/448; 257/921; 307/311; 359/58; 359/60; 345/91; 327/514
[58] Field of Search ..................... 257/88, 89, 90, 257/91, 93, 99, 921, 443, 448, 291, 292; 307/311; 345/91, 98; 359/60, 58, 57

[56] References Cited

U.S. PATENT DOCUMENTS

| | | | |
|---|---|---|---|
| 3,388,255 | 6/1968 | May | 257/88 X |
| 3,781,862 | 12/1973 | Yamamura | 359/60 X |
| 4,636,788 | 1/1987 | Hilbrink | 345/91 |
| 4,641,135 | 2/1987 | Hilbrink | 345/91 |
| 4,794,385 | 12/1988 | Kuijk | 359/91 X |
| 5,121,146 | 6/1992 | Smith et al. | 257/88 X |

FOREIGN PATENT DOCUMENTS

| | | | |
|---|---|---|---|
| 54-112187 | 9/1979 | Japan | 257/918 |
| 63-221323 | 9/1988 | Japan | 359/60 |
| 2168229 | 6/1990 | Japan | 359/60 |
| 3256372 | 11/1991 | Japan | 257/918 |

*Primary Examiner*—William Mintel
*Attorney, Agent, or Firm*—Eugene A. Parsons

[57] ABSTRACT

An electro-optic integrated circuit including an addressable array of light emitting devices, a column decoder and a plurality of address lines formed on the substrate. There are address lines each including an external connection pad. The decoder includes a switching circuit connected to each column for activating the column and a plurality of sets of diodes connected to the address lines and the switching circuits so that each set of diodes has a unique code produced by a combination of diodes in that set and the address lines to which the diodes in that set are connected.

12 Claims, 9 Drawing Sheets

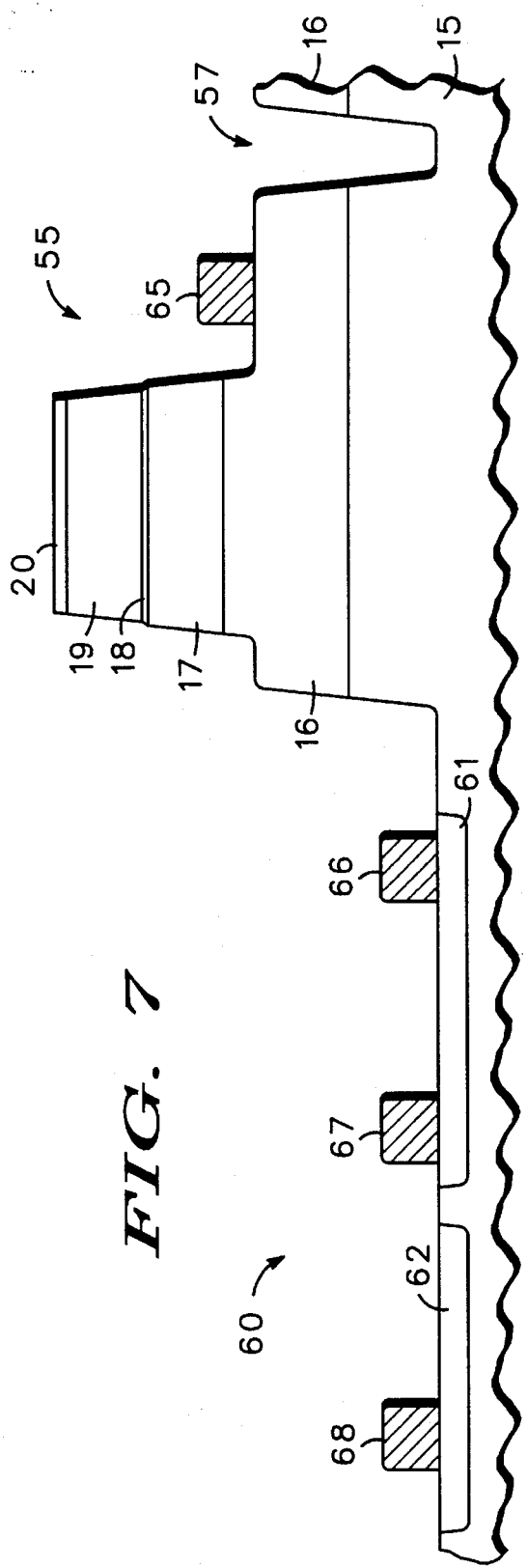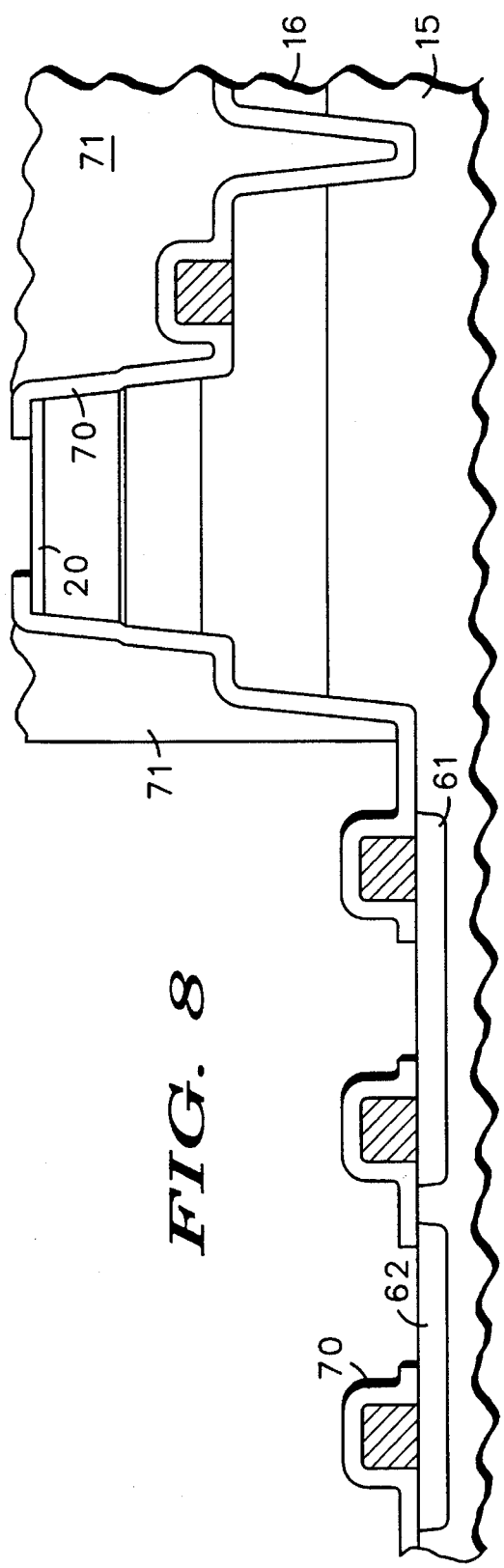

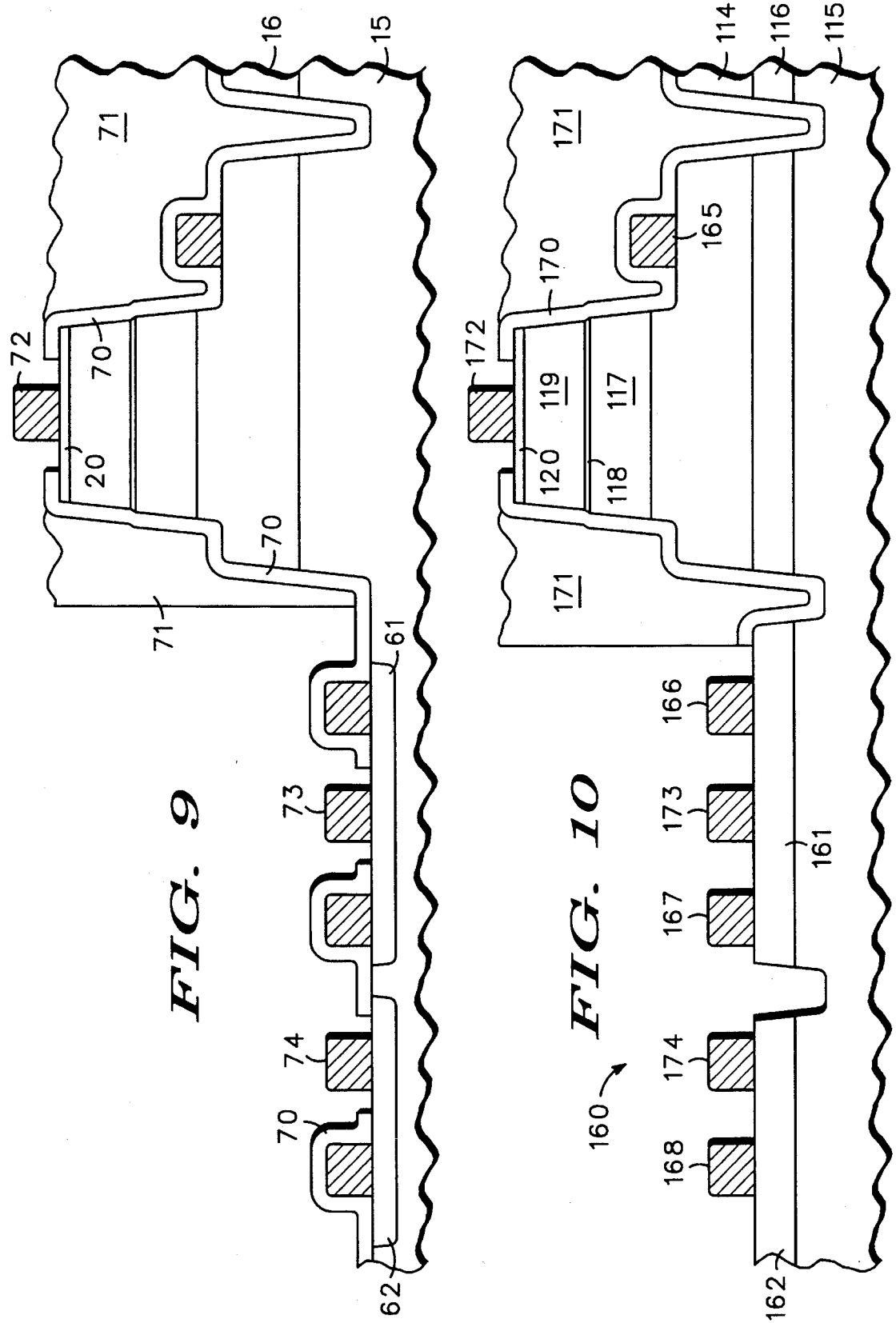

5,483,085

ELECTRO-OPTIC INTEGRATED CIRCUIT WITH DIODE DECODER

FIELD OF INVENTION

The present invention pertains to electronics for array scanning and more specifically to drive and interconnect circuits for optical arrays and the like.

BACKGROUND OF THE INVENTION

Two dimensional arrays of visible light emitting devices, such as light emitting diodes (LEDs), are becoming very useful in displays for portable electronic devices, such as telephones, cellular telephones, two-way radios, pagers, etc. Generally, these two dimensional arrays include large numbers of light emitting devices, from 5000 to 80,000 or more, with a specific example being 144 rows by 240 columns. An array the size of this specific example requires a total of 384 external interconnections to properly scan, or activate, to produce an image thereon.

A major problem facing the productizing of such arrays is the penalty paid for this very large number of connection, or bond, pads required to provide information to the array. The foremost drawback is the increased semiconductor die area required for the bond pads and interconnect fanout to connect the bond pads to the rows and columns. A significant portion of the projected cost of the semiconductor chip on which the array is constructed is in the starting material and, with the 144×240 example set up for wire bonded external interconnects, the emitting region (light emitting diode array) occupies less than 20% of the total die area with the remaining 80% required for bond pads and interconnect fan out. Direct chip attach (DCA) bonding will improve this ratio only slightly because of the larger pad sizes and interconnect pitches associated with the current state-of-the-art.

A larger bonding substrate area is also required since a similar pad and interconnect fanout pattern must be repeated on accompanying semiconductor chips containing the drive electronics. Furthermore, the drive chips themselves must be large to accommodate the large number of bond pads (384 in this example). The net result is a large overall module which is not attractive for the applications of portable electronic devices where a premium is placed on small physical volumes.

Therefore, it is highly desirable to achieve improved interconnect apparatus and methods of fabricating the improved interconnect apparatus.

It is a purpose of the present invention to provide new and improved integrated circuitry for driving large arrays of semiconductor devices.

It is a further purpose of the present invention to provide new and improved integrated circuitry which requires less semiconductor chip area for larger arrays of devices.

It is another purpose of the present invention to provide new and improved integrated circuitry which is relatively easy to fabricate and use.

It is another purpose of the present invention to provide new and improved integrated circuitry with new and improved arrays of light emitting devices.

It is still another purpose of the present invention to provide new and improved electro-optic integrated circuitry which is small enough to be conveniently used in portable electronic equipment.

SUMMARY OF THE INVENTION

The above problems and others are at least partially solved and the above purposes and others are realized in an integrated circuit including an addressable array of semiconductor devices formed on a substrate, with all of the semiconductor devices being connected in rows and columns. A column decoder is formed on the substrate and includes a plurality of switching circuits equal in number to the number of columns in the array, with each of the columns having a different one of the plurality of switching circuits connected thereto for activating the column upon activation of the switching circuit. A plurality of address lines are also formed on the substrate and each address line includes an external connection pad. A plurality of sets of diodes are formed on the substrate and connected to the address I lines and the switching circuits so that each set of diodes has a unique code produced by a combination of diodes in that set and the address lines to which the diodes in that set are connected.

The above problems and others are at least partially solved and the above purposes and others are further realized in a method of fabricating an electro-optic integrated circuit including the steps of providing a substrate of nonconductive material with a major surface and a plurality of layers of material positioned on the major surface, separating portions of the plurality of layers of material into a plurality of light emitting devices positioned in rows and columns, providing an electronics area of the substrate adjacent the plurality of light emitting devices, and forming a plurality of switching transistors and switching diodes in the electronics area and address lines between the electronics area and the columns of light emitting devices, including depositing first and second metallization layers electrically connecting the plurality of light emitting devices in rows and columns and connecting the switching transistors, switching diodes and address lines to the columns of light emitting devices to form a column decoder having fewer address lines than columns of light emitting devices.

BRIEF DESCRIPTION OF THE DRAWINGS

Referring to the drawings:

FIGS. 7 through 9 are simplified sectional views illustrating various steps in a fabrication process of an embodiment of an electro-optic integrated circuit embodying the present invention, portions thereof broken away;

FIGS. 10 through 13 are simplified sectional views illustrating other embodiments of electro-optic integrated circuits embodying the present invention, portions thereof broken away.

DESCRIPTION OF THE PREFERRED EMBODIMENTS

Figure 1:
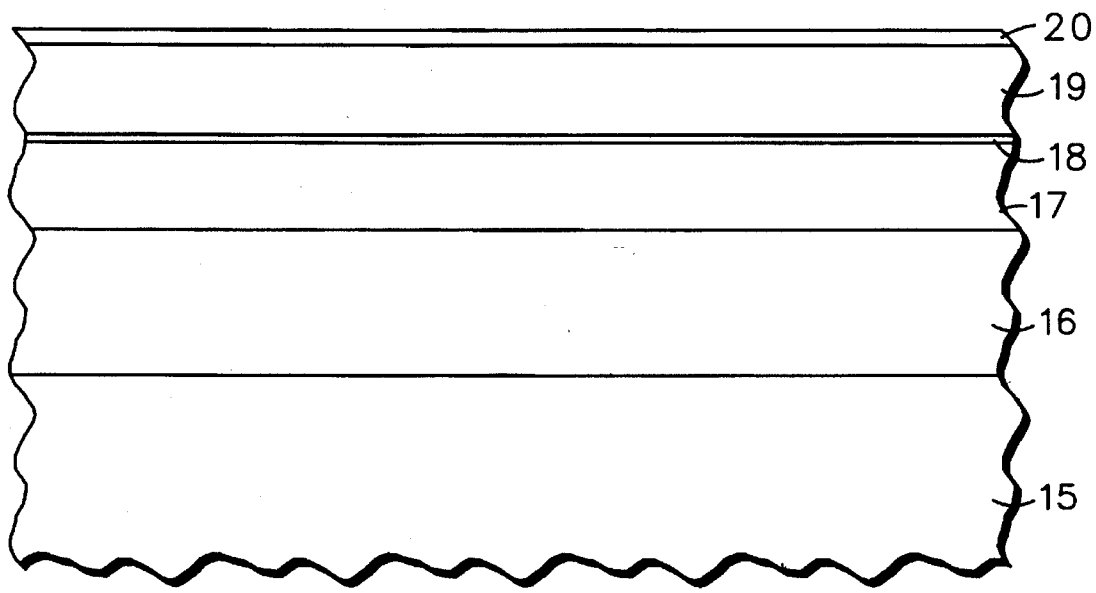
FIGS. 1 through 5 are simplified sectional views illustrating various steps in a fabrication process of an array of light emitting diodes, portions thereof broken away.

Referring specifically to FIG. 1, a first structure in a fabrication process of an array of light emitting diodes is illustrated in a simplified sectional view, portions thereof broken away. The structure includes a substrate 15 having an upper surface on which is positioned, in the following order, a conductive layer 16, a first carrier confinement layer 17, an active layer 18, a second carrier confinement layer 19 and a conductive cap layer 20.

In a specific embodiment of the fabrication process, substrate 15 is formed of undoped gallium arsenide (GaAs) so that substrate 15 is a semi-insulating semiconductor. Conductive layer 16 is a layer of GaAs epitaxially grown on the surface of substrate 15 and is heavily doped ($10^{18}$) with silicon to make it a relatively good N+-type conductor. In this specific example, conductive layer 16 is grown to a thickness in the range of approximately 1000–10,000 angstroms. First carrier confinement layer 17 is a layer of indium-gallium-aluminum phosphide epitaxially grown on the surface of conductive layer 16 and doped (in the range of approximately $10^{17}$–$10^{18}$) with silicon for N-type semiconductivity. In this specific embodiment, carrier confinement layer 17 is grown to a thickness in the range of approximately 1000–8000 angstroms. Active layer 18 is an undoped layer of indium-gallium-aluminum phosphide epitaxially grown on the surface of carrier confinement layer 17 to a thickness in the range of approximately 100–1000 angstroms. Second carrier confinement layer 19 is a layer of indium-gallium-aluminum phosphide epitaxially grown on the surface of active layer 18 and doped (in the range of approximately $10^{16}$–$10^{18}$) with zinc for P-type semiconductivity. In this specific embodiment, carrier confinement layer 19 is grown to a thickness in the range of approximately 1000–8000 angstroms. Conductive cap layer 20 is epitaxially grown on the surface of carrier confinement layer 19 to a thickness in the range of approximately 200–1000 angstroms and is heavily doped (approximately $10^{19}$) with zinc to make it a good P+-type conductor. The molecular fraction of aluminum in carrier confinement layers 17 and 19 is in the range of approximately 0.7–1.0 and in active layer 18 is in the range of approximately 0.0 to 0.24. For simplicity of fabrication in the specific example disclosed, layers 16 through 20 are epitaxially grown as blanket layers over the entire substrate 15 but it will be understood that other methods, including masking and selective growth or selective etching, can be utilized to provide the area necessary for the following steps.

Figure 2:
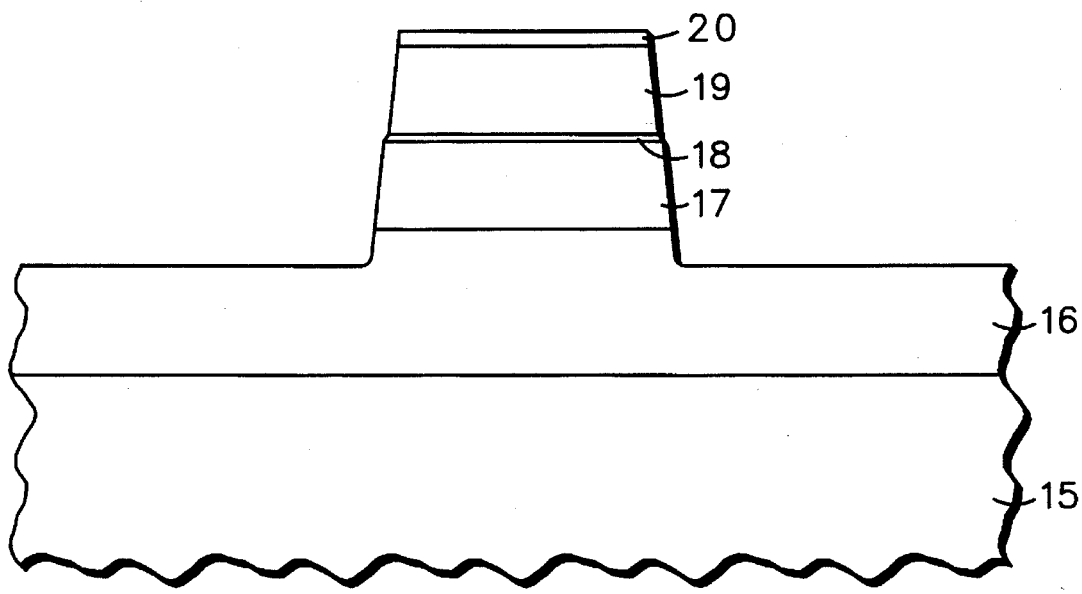

Referring specifically to FIG. 2, a second structure is illustrated in which portions of cap layer 20, carrier confinement layer 19, active layer 18, carrier confinement layer 17 and a portion of conductive layer 16 have been separated to form mesas organized into a two dimensional array or matrix of rows and columns (only one mesa illustrated for convenience). The upper surface of each mesa in the array defines a light emitting area for a light emitting diode. In the specific example illustrated, a methane-hydrogen dry etch chemistry is used to etch through the various layers to define the mesas. A layer of dielectric ($Si_3N_4$) is used as a mask for the etching step.

Figure 3:
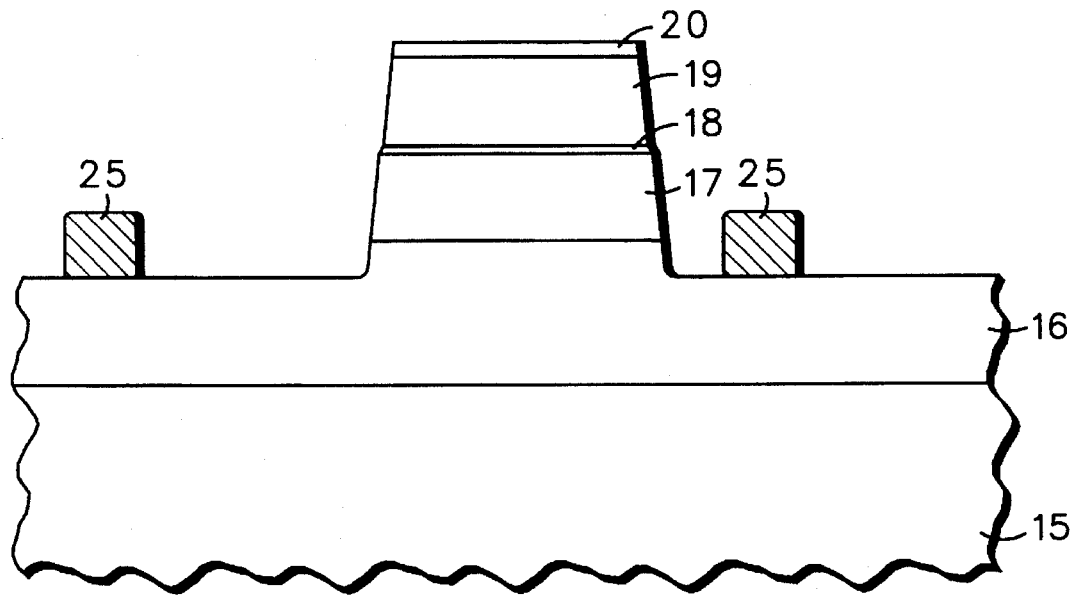

In a next step of this specific example, as illustrated in FIG. 3, N-contact metal is applied to the exposed surface of conductive layer 16 using standard lift-off techniques. The N-contact metal utilized in this example is Ni/Ge/Au and is alloyed at approximately 450° C. to form an ohmic contact, designated 25, for the cathode of each of the light emitting diodes. The metallization, or ohmic contact 25, extends the entire length of each row between adjacent mesas and thus serves as the row current bus. In the example including 144 rows of light emitting diodes in the two dimensional array, there are 144 row current buses or ohmic contacts 25.

Figure 4:
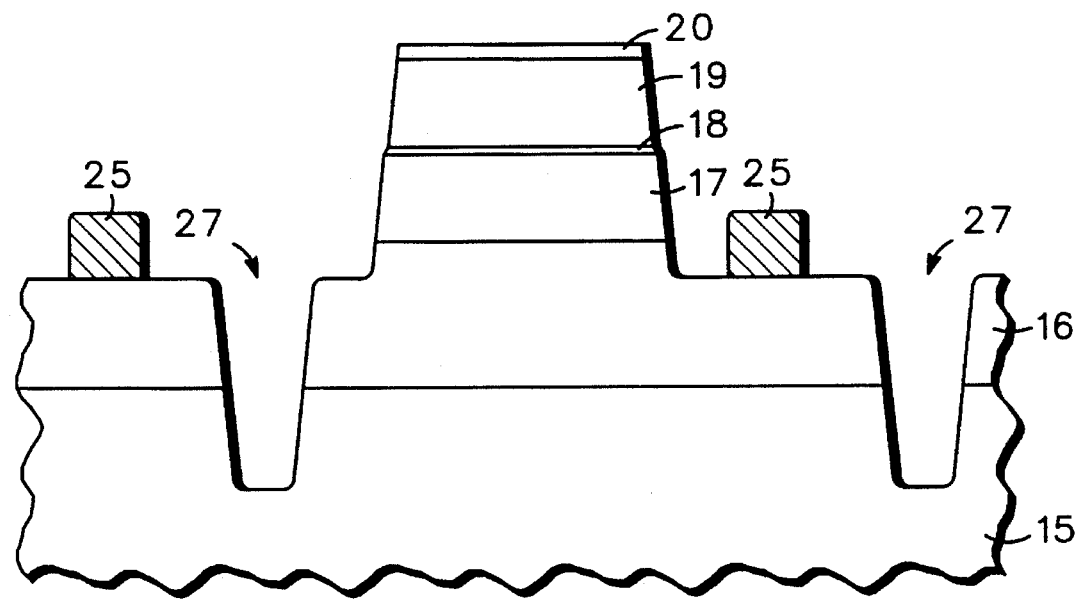

Referring specifically to FIG. 4, a row isolation step is performed by etching trenches 27 through conductive layer 16 and partially into substrate 15. Trenches 27 are etched between ohmic contacts 25 and the next adjacent row of mesas and extend the entire length of each row so that each ohmic contact 25 is associated with only one row of mesas and each row of mesas is electrically separated from each other row of mesas. The row isolation etch, in this example, is a wet chemical etching step utilizing $NH_4OH:H_2O_2:H_2O$ and a photoresist mask.

Figure 5:
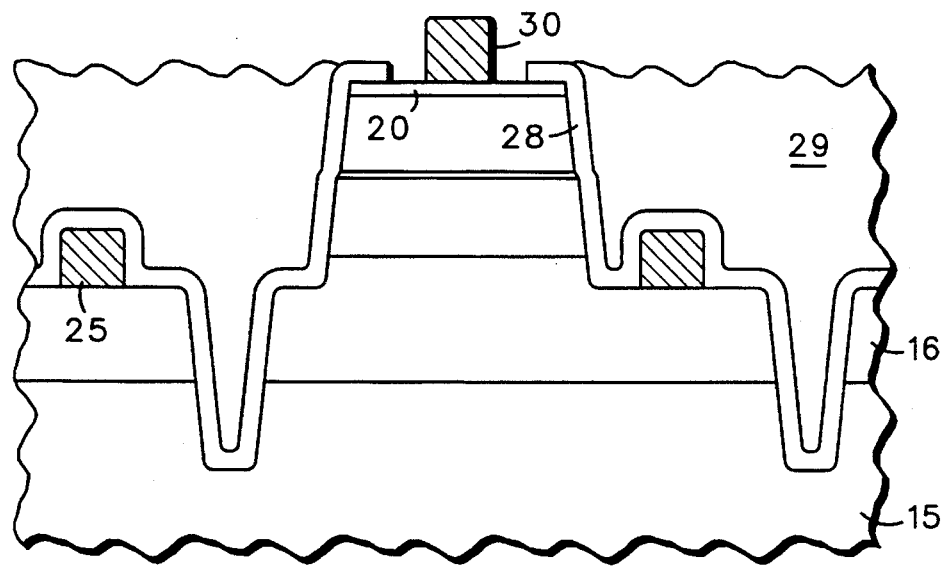

A layer 28 of dielectric material, which in this specific example is $Si_3N_4$, is then deposited over the wafer to provide passivation of the etched surfaces and isolation between metal layers, as illustrated in FIG. 5. The wafer surface is replanarized with a layer 29 of polyimide. Vias are then etched in layer 29 and layer 28 on the top of each of the mesas to provide access to conductive cap layer 20. In a next step of this specific example, as further illustrated in FIG. 5, P-contact metal is applied to the exposed surface of conductive cap layer 20 using standard lift-off techniques. The P-contact metal utilized in this example is Ti/Pt/Au and is alloyed at approximately 250° C. to form an ohmic contact, designated 30, for the anode of each of the light emitting diodes. The metallization, or ohmic contact 30, extends from the top of each mesa into a space between adjacent columns of mesas and the entire length of each column between adjacent mesas, as seen for example in FIG. 13, and thus serves as the column current bus. In the example including 240 columns of light emitting diodes in the two dimensional array, there are 240 column current buses or ohmic contacts 30.

Figure 6:
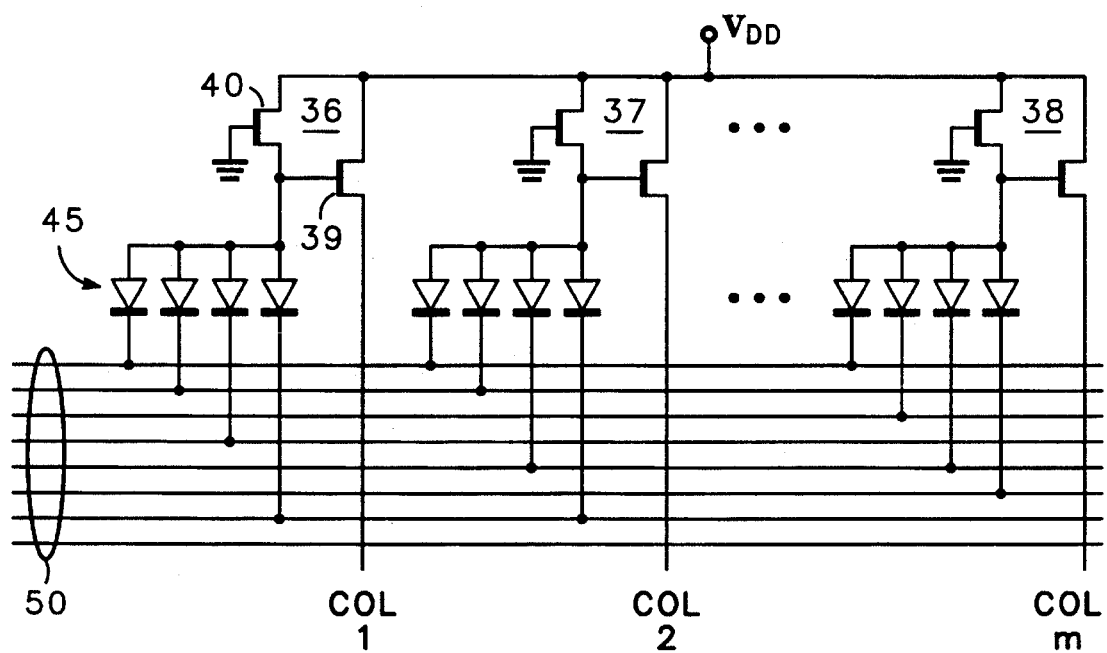
FIG. 6 is a schematic view of a column decoder designed to operate in conjunction with the array of FIG. 5 in accordance with the present invention, portions thereof broken away.

Referring specifically to FIG. 6, a schematic view of a column decoder 35 is illustrated, portions thereof broken away, which is designed to operate in conjunction with an array similar to that illustrated in FIG. 5 in accordance with the present invention. Column decoder 35 includes a plurality of switching circuits 36, 37 and 38 a separate one of which is connected to each column current bus (ohmic contacts 30 in FIG. 5). Each switching circuit 36, 37, to 38 is similar and, therefore, only switching circuit 36 will be described in detail.

Switching circuit 36 includes a pair of switching transistors 39 and 40, which in this embodiment are depletion mode MESFETs. Transistor 39 has a drain connected to a terminal designated $V_{dd}$, adapted to have a potential source connected thereto, and a source connected to the first column in the array. With transistor 39 turned on, potential source $V_{dd}$ is connected to the anode of each light emitting diode in the first column. Transistor 39 further has a gate which is connected to the source of transistor 40. The drain of transistor 40 is connected to terminal $V_{dd}$ and the gate is connected to a reference potential such as ground. The source of transistor 40 is further connected to common connected anodes of a set of diodes 45, the cathodes of which are connected to specific ones of a plurality of address lines 50. Set of diodes 45, and the sets of diodes for each other switching circuit 37 to 38, and address lines 50 are connected to produce a unique code for each switching circuit 36 to 38. Address lines 50 are formed on the substrate, as will be described presently and each address line includes an external connection pad for receiving addresses from an external source (off chip).

In operation, any address lines 50 not being addressed are held at a low logic level, forward biasing any diodes of the various sets and pulling the potential of the gate of transistor 39 (for example) to a low potential. Thus, when not specifically addressed, transistor 39 is biased in an OFF state and switching circuit 36 is OFF. To specifically address the first column current bus, the correct address must be applied to address lines 50 to reverse bias each diode in set of diodes 45. With all of the diodes in diode set 45 reverse biased (high logic level), the gate potential to transistor 39 rises and switches to a conducting mode, allowing current to flow through the first column current bus. All of the sets of diodes are connected to address lines 50 so that each set has a unique address and all other sets of diodes have at least one forward biased diode therein.

Referring now to FIGS. 7 through 9 various steps in a fabrication process of an embodiment of an electro-optic integrated circuit embodying the present invention are illustrated in simplified sectional views, portions thereof broken away. A mesa structure illustrated in FIG. 7, designated 55, is constructed substantially as described in conjunction with FIG. 1 and the substrate and various epitaxial layers are designated with the same numbers as in FIG. 1. With the various epitaxial layers, 16, 17, 18, 19 and 20 etched to define a plurality of mesas 55 arranged in an array of rows and column, an isolation etch is performed to form channels 57 through conductive layer 16 and into substrate 15. Simultaneously, the isolation etch step removes all of the epitaxial layers and exposes a surface of substrate 15 in an electronics area 60. In this specific embodiment electronics area 60 is adjacent to the array of light emitting diodes and positioned to utilize the minimum amount of chip area.

Utilizing normal implanting procedures, portions are selectively implanted in electronics area 60 to define a plurality of conductive channels 61 and 62. In this embodiment, silicon is used as the implant impurity to provide N+-type conductive channels 61 and 62. It should be understood that conductive channels 61 and 62 are only representative and sufficient conductive channels to fabricate switching circuits 36–38 and sets of diodes 45, etc. (FIG. 6) must be provided. An anneal step is then performed to activate each of the conductive channels 61 and 62.

A first, or N-type, metallization step is then performed to form an ohmic contact, designated 65, for the cathode of each of the light emitting diodes. The metallization, or ohmic contact 65, extends the entire length of each row between adjacent mesas and thus serves as the row current bus. Also, drain and source contacts 66 and 67 are formed on conductive channel 61 and an ohmic contact 68 is formed on conductive channel 62 to define a diode cathode. N-contact metal is applied to the exposed surface of conductive layer 16 and conductive channels 61 and 62 using standard lift-off techniques. The N-contact metal utilized in this example is Ni/Ge/Au and is alloyed at approximately 450° C.

A layer 70 of dielectric material, which in this specific example is $Si_3N_4$, is then deposited over the wafer to provide passivation of the etched surfaces and isolation between metal layers, as illustrated in FIG. 8. The wafer surface is replanarized with a layer 71 of polyimide. Vias are then etched in layers 71 and 70 on the top of each of the mesas to provide access to conductive cap layer 20. Using the same etch process the layer 71 of polyimide can be etched completely away in electronics area 60, or electronics area 60 can be masked so that layer 71 of polyimide is not deposited thereon. As will be understood by those skilled in the art and depending upon the specific connection of components formed on electronics area 60, the replanarizing may be limited to only the array of light emitting diodes.

In a next step of, as illustrated in FIG. 9, P-contact metal is applied to the exposed surface of conductive cap layer 20, conductive channel 61 and conductive channel 62 using standard lift-off techniques. An ohmic contact, designated 72, is formed at the top of each mesa 55 for the anode of each of the light emitting diodes. The metallization, or ohmic contact 72, extends from the top of each mesa into a space between adjacent columns of mesas and the entire length of each column between adjacent mesas, as seen for example in FIG. 13, and thus serves as the column current bus. A gate electrode 73 is formed on the surface of each conductive channel 61 to complete each switching transistor utilized in the plurality of switching circuits 36–38. Further, a Schottky contact 74 is formed with each conductive channel 62 to form the anode for each diode in each set of diodes 45. Generally, the anodes of the sets of Schottky diodes are connected together by the same metallization step. Further, the various circuit interconnections are formed during the metallization steps, generally, address lines 50 and the interconnects are formed during the P-contact metallization step. The P-contact metal utilized in this example is Ti/Pt/Au and is alloyed at approximately 250° C.

Referring specifically to FIG. 10, another embodiment of an electro-optic integrated circuit embodying the present invention is illustrated, portions thereof broken away. In this embodiment, an N-GaAs conductive channel layer 116 is epitaxially grown on the surface of a substrate 115 and an AlGaAs spreading layer 114, a carrier confinement layer 117, an active layer 118, a second carrier confinement layer 119 and a conductive cap layer 120 are epitaxially grown on top, generally as previously described. A selective etch is then performed, through layers 120, 119, 118, 117 and into 114, to define an array of light emitting diode mesas separated into rows and columns. A second etch step is performed to expose an electronics area 160 of N-GaAs channel layer 116. An isolation etch is then performed to electrically separate mesas 155 into rows and to separate electronics area 160 into separate channels 161 and 162, etc. A first metallization step, a passivation and replanarization step and a second metallization step are then performed, substantially as described above, to form row and column electrodes and current buses 165 and 172, respectively, FET source, drain and gate electrodes 166, 167 and 173, respectively, and Schottky diode cathode and anode electrodes 168 and 174, respectively.

No additional process steps are required for this structure, but the mesa etch step is modified to include a selective wet etch of the AlGaAs layer 114, exposing channel layer 116 for contacting by FET and diode electrodes. An HF based etch solution can be used for the wet etch. The advantages of this method and circuit embodiment are that it avoids the implant and anneal steps and no additional process steps are required. The disadvantage is that channel layer 116 is buried underneath layers 120, 119, 118, 117 and 114, making access to it more complicated. Further, FET characteristics are subject to nonuniformities in the thickness and doping of channel layer 116 across the wafer.

Figure 11:
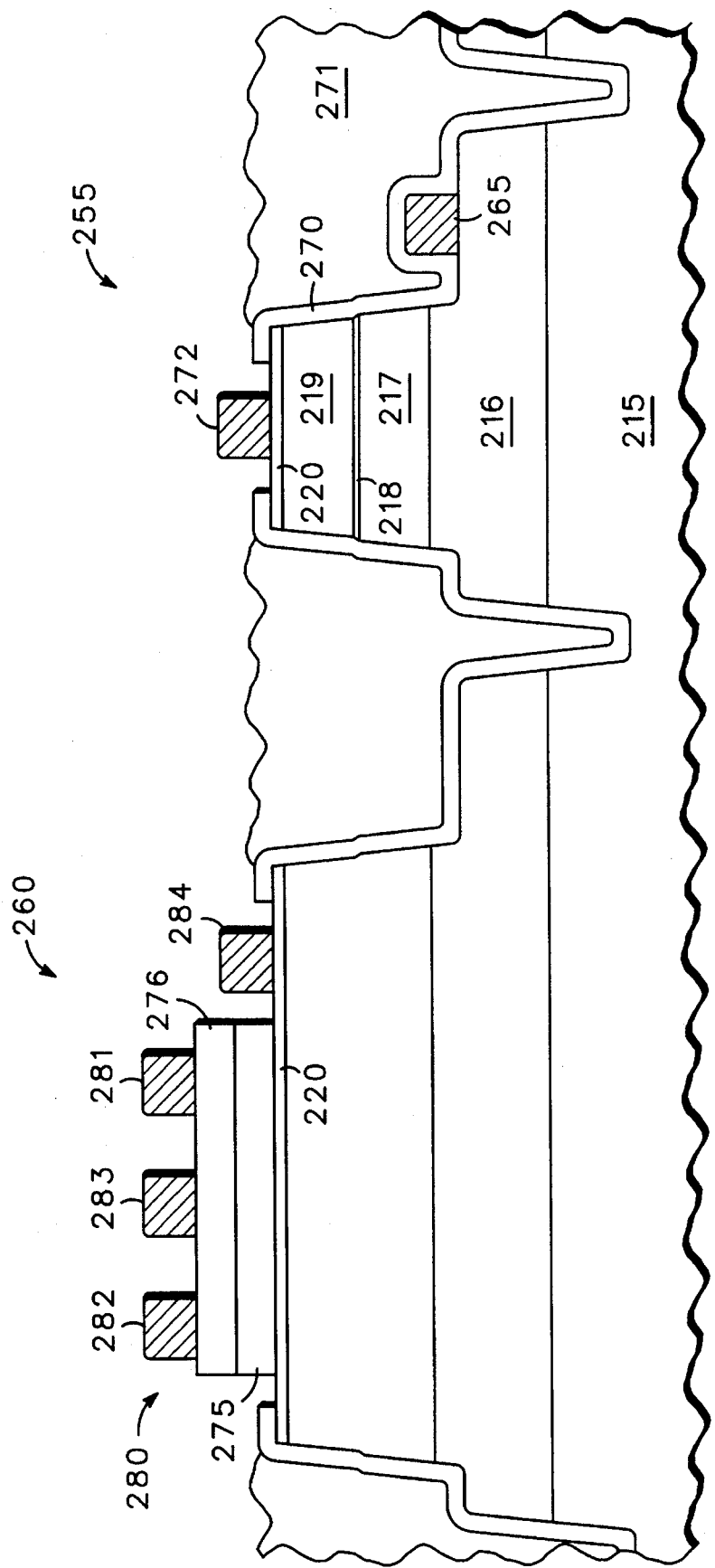

Referring specifically to FIG. 11, another embodiment of an electro-optic integrated circuit embodying the present invention is illustrated, portions thereof broken away. In this embodiment, a conductive channel layer 216 is epitaxially grown on the surface of a substrate 215 and a carrier confinement layer 217, an active layer 218, a second carrier confinement layer 219 and a conductive cap layer 220 are epitaxially grown on top, generally as previously described. A selective etch is then performed, through layers 220, 219, 218, 217 and into 216, to define an array of light emitting diode mesas 255 separated into rows and columns. A row isolation etch is then performed to electrically separate mesas 255 into rows and to separate electronics area, or areas, 260 from mesas 255. A passivation and replanarization step is then performed to deposit passivation layer 270 and replanarization layer 271.

A via, or vias, are opened in the electronics area 260 to provide an area for the formation of a MESFET 280. A lightly doped P-type AlGaAs layer 275 is epitaxially grown directly onto conductive cap layer 220 and an N-type GaAs channel layer 276 is grown on layer 275. It will of course be understood by those skilled in the art that epitaxial layers 275 and 276 are generally grown with (during the same process) epitaxial layers 216, 217, 218, 219 and 220 and then etched away in areas in which they are not needed. A first metallization step, is performed, substantially as described above, to form cathode ohmic contacts and row current buses 265 and MESFET drain and source contacts 281 and 282. Insulation or passivation layers (not shown) are deposited to insulate the various electrodes from each other during deposition. If the row isolation etch was not previously performed, it can be performed at this time. Vias are opened at the correct positions to allow deposition of P-type metal. The P-type metallization is then performed, generally as described above, to form the light emitting diode anode ohmic contacts at the top of each mesa 255 and the column current buses 272. Also, a MESFET gate contact 283 is formed for each MESFET 280 and a pinch-off contact 284 is formed in electronics area 260 but directly on conductive cap layer 220 adjacent MESFET 280.

MESFET 280 is non-conventional as typical GaAs MESFETs are fabricated on semi-insulating substrates which provide for conventional isolation and a potential barrier against which the channel can be pinched-off by the gate. In MESFET 280, a barrier is provided by the P-N junction formed between channel layer 276 and layer 275. As long as the potential of layer 275 remains fixed, channel layer 276 can be pinched-off by applying a proper potential to gate terminal 283 and MESFET 280 acts as a switching transistor. In MESFET 280, layer 275 is held at a constant potential (typically the source potential) by way of pinch-off contact 284, which contacts conducting layer 220 beneath layer 275.

Not only are the light emitting diode associated with the switching circuit and MESFET 280 non-interfering, but there is some synergy between the structures. The functions of the P-type layers are overlapping, providing contact to the anode of the light emitting diode and layer 275 of MESFET 280. As the required frequency response of MESFET 280 is very minimal in the display application, the capacitance associated with the P-N junction is not a major factor. It should be noted that Schottky diodes can be formed with gate metal on the channel layer, generally as previously described, or P-N junction diodes can be formed between ohmic contacts to channel layer 276 and layer 275.

Fabrication of MESFET 280 requires only the additional process steps of epitaxially growing two additional layers 275 and 276 for the formation of the MESFET and etching them away everywhere except over electronics area 260. The various etch steps are performed generally as previously described and most of the remaining steps are or can be performed concurrently, as previously described.

Figure 12:
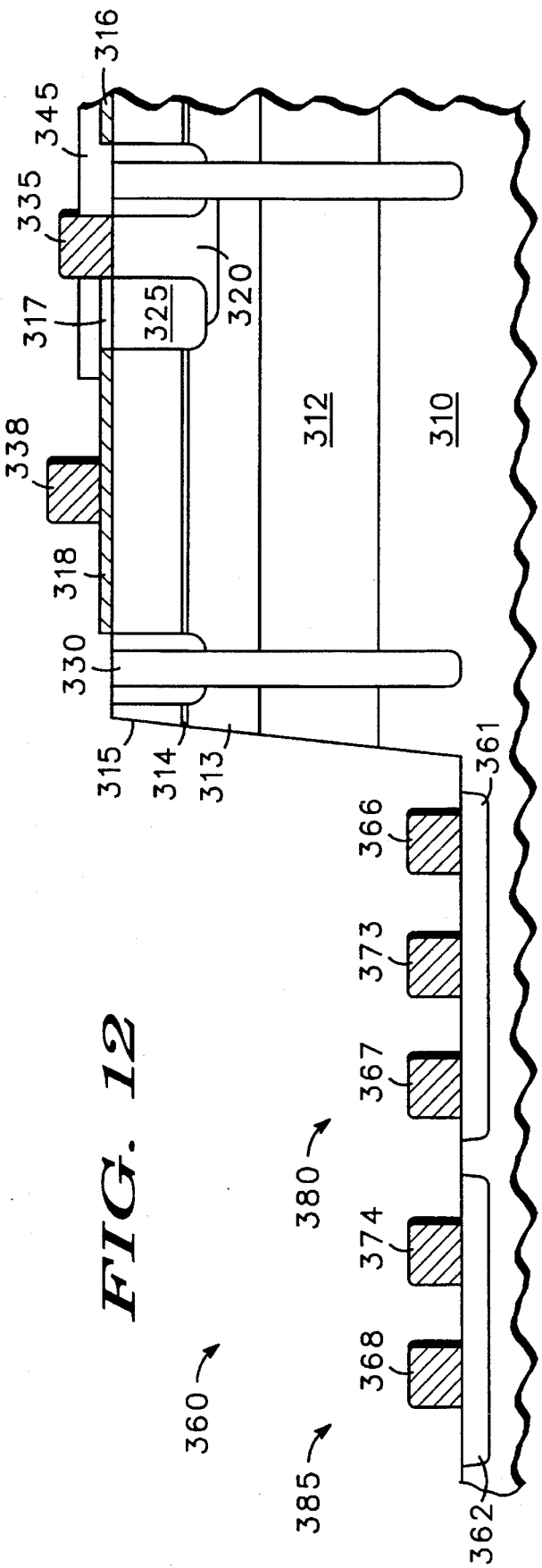
Figure 14:
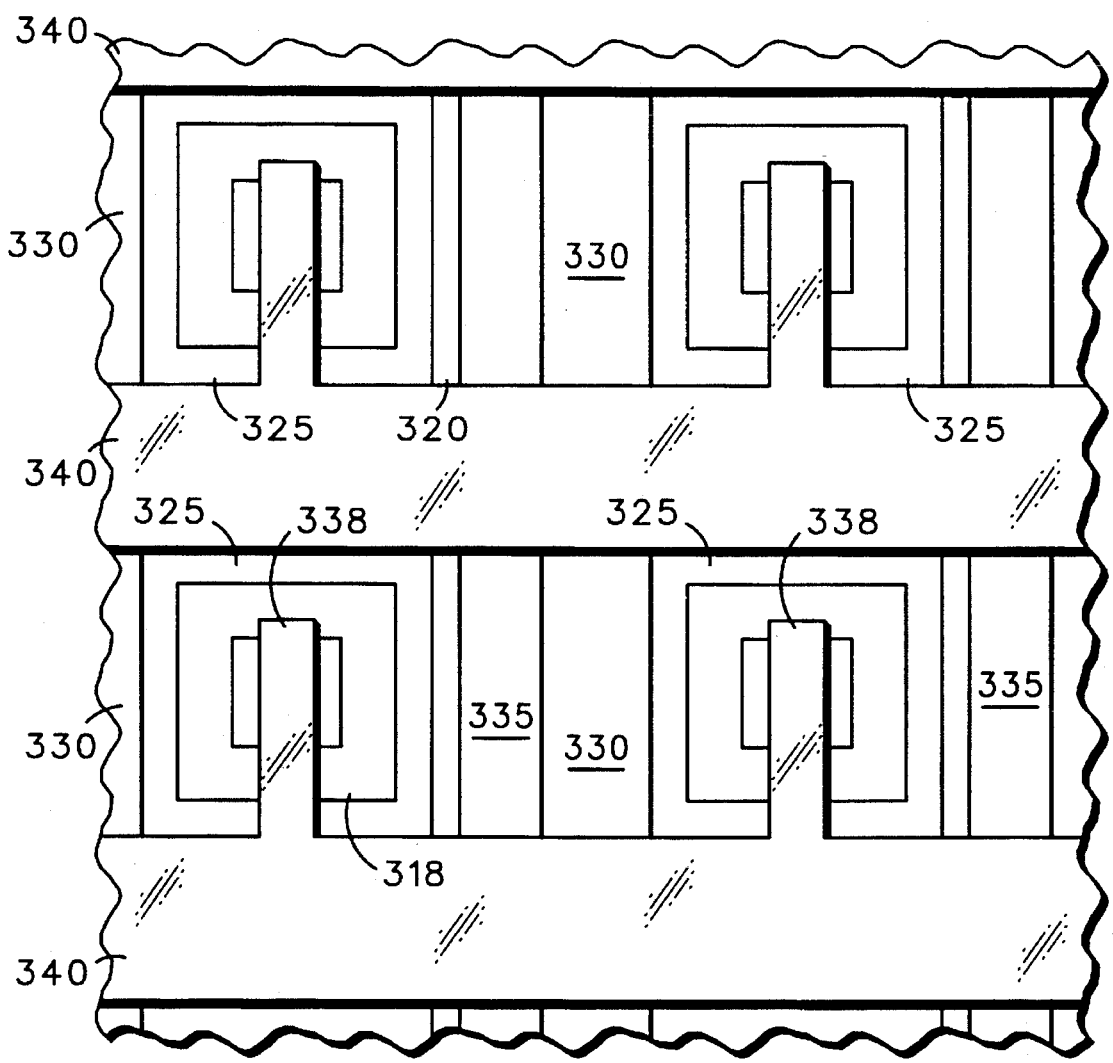
FIG. 14 is a view in top plan of a portion of the array of FIG. 12.

Referring specifically to FIG. 12, another embodiment of an electro-optic integrated circuit embodying the present invention is illustrated, portions thereof broken away. This embodiment includes a substrate 310 having a heavily doped conductive layer 312 formed thereon. A first carrier confinement layer 313, an active layer 314 and a second carrier confinement layer 315 are formed on conductive layer 312. Generally, these layers are formed using material and steps similar to those described above. A cap layer 316 is selectively formed on carrier confinement layer 315 by any of several well known methods. For example, cap layer 316 is epitaxially grown as a blanket layer and areas 317 are removed by some convenient method such as etching to expose the surface of carrier confinement layer 315. The exposed areas of carrier confinement layer 315 define exposed row areas and exposed column areas so as to separate the remaining portions of cap layer 316 into a matrix of diode light emitting areas 318. Reference to the top plan view of FIG. 14 during this description will aid in an understanding of the structure.

A plurality of surface contacts to conductive layer 312 are formed by converting a vertical pillar 320 of P-type semiconductive material in carrier confinement layer 315 and the material of active layer 314 to heavily doped N-type conductive material. The conversion is accomplished by implanting an impurity in the exposed row areas 317 at the predetermined positions of vertical pillars 320. In this embodiment the surface contacts are formed in rows and a surface contact is provided for each light emitting diode in each row, to reduce the resistance of the connections to the lower contact of each light emitting diode.

Confinement of each light emitting diode is achieved by implanting impurities to form an isolating resistive volume, or moat 325, around each of the defined light emitting areas 318. Resistive moat 325 laterally confines current flow across the p-n junction (carrier confinement layer 315, active layer 314 and carrier confinement layer 313) of each of the light emitting diodes and, therefore, defines the emitting region of each of the light emitting diodes. It should be noted that resistive moat 325 also acts to eliminate any parasitic, implanted p-n junctions at the interface between each light emitting diode (p-type carrier confinement layer 315 and active layer 314) and N-type vertical pillars 320. Also, p-type GaAs cap layer 316 is etched away above resistive moats 325 to prevent the formation of any parasitic p-n junctions.

In the present embodiment, the exposed row areas and exposed column areas define a matrix of diode light emitting areas 318, which may, for example, contain as many as 200 or 300 columns and 100 or 200 rows of light emitting diodes, or in some special applications even more. Isolation of the light emitting diodes into rows in the array is provided by an isolation implant 330 extending like a substantially continuous wall between each adjacent pair of rows of light emitting diodes. Implant 330 extends downwardly through carrier confinement layer 315, active layer 314, carrier confinement layer 313 and conductive layer 312 to electrically isolate adjacent rows from each other.

An electronics area 360 is formed adjacent the diode matrix, as in any of the previous processes. In the embodiment illustrated in FIG. 12, a portion of the surface of substrate 310 is separated from the light emitting diode array by etching, and steps somewhat similar to those described in conjunction with FIGS. 7–9 are utilized for convenience. Utilizing normal implanting procedures, portions are selectively implanted in electronics area 360 to define a plurality of conductive channels 361 and 362. In this embodiment, silicon is used as the implant impurity to provide N+-type conductive channels 361 and 362. As previously described., conductive channels 61 and 62 are only representative and sufficient conductive channels to fabricate switching circuits and sets of diodes etc. (FIG. 6 for example) must be provided. An anneal step is then performed to activate each of the conductive channels 361 and 362.

N-type and p-type metallization steps are then performed to form ohmic contacts 366, 367 and 368 and ohmic or Schottky contacts 373 and 374, as described previously in conjunction with FIGS. 7, 8 and 9, and to form the cathode and anode of each of the light emitting diodes. Utilizing these steps a plurality of MESFETs 380 and a plurality of Schottky diodes 385 are formed in electronics area 360. A layer of dielectric material may be deposited over the wafer to provide passivation of the etched surfaces and isolation between metal layers, generally as illustrated in FIG. 8. Replanarizing of the mesas is generally not required in this specific fabrication method because the mesas are defined by implants rather than etching.

Figure 13:
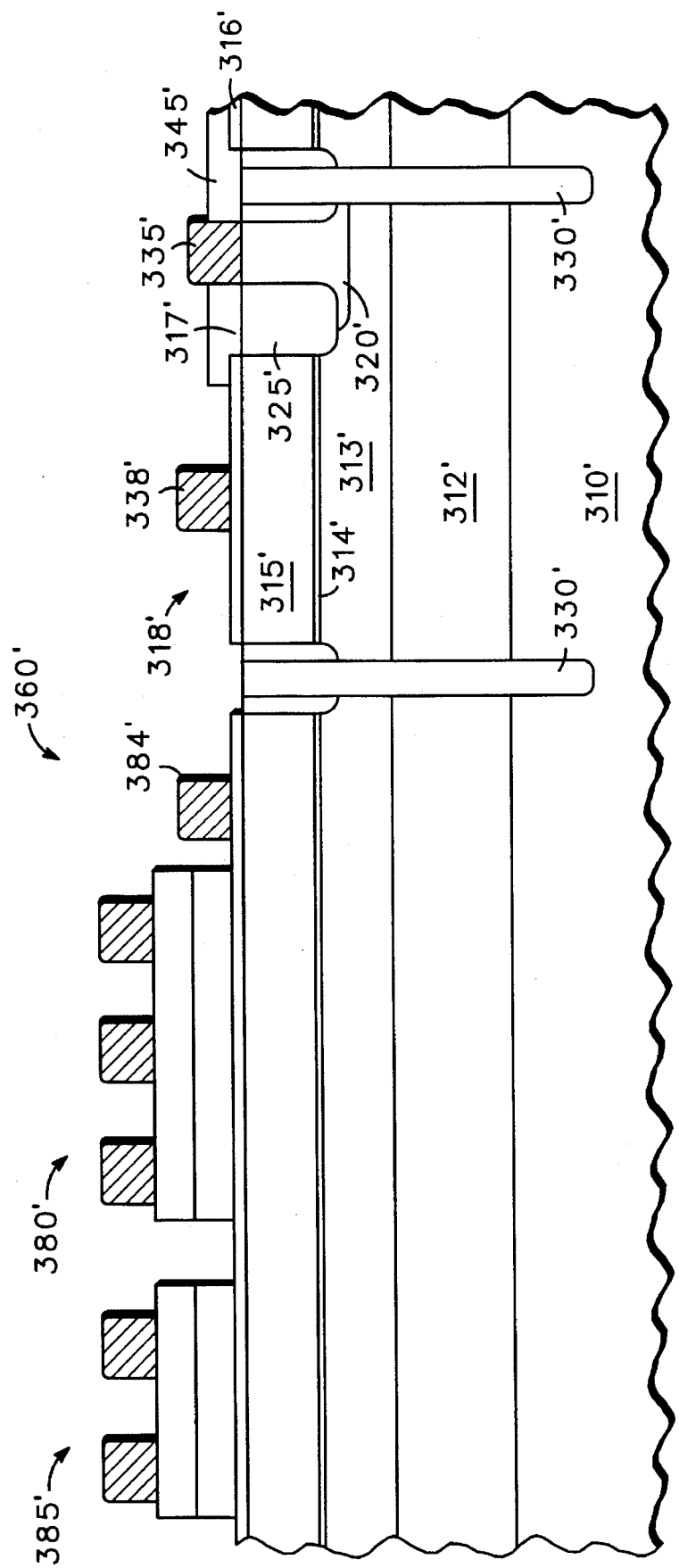

In an embodiment illustrated in FIG. 13, steps somewhat similar to those described in conjunction with FIG. 11 are utilized for convenience. Components of FIG. 13 which are similar to components of FIG. 12 are designated with similar numbers and each number has a prime added to indicate that it is a different embodiment. In this embodiment electronics area 360' is not etched but is simply formed on top of cap layer 220' generally utilizing the same steps as described in conjunction with the embodiment illustrated in FIG. 11. Utilizing similar steps a plurality of MESFETs 380' and a plurality of Schottky diodes 385' are formed in electronics area 360'.

While it will be understood that MESFETs 380' may be formed as conventional MESFETs, in this specific embodiment non-conventional MESFETs similar to those illustrated in FIG. 11 are illustrated. Each MESFET 380' includes a p-n barrier and a pinch-off contact 384', which operates basically as previously described. It will of course be understood that any of the other methods of forming MESFETs and sets of diodes in an electronics area could be used in conjunction with the implanted array of light emitting diodes.

Additional information on the implant type of light emitting diode array and methods of fabrication is available in a copending application entitled "IMPLANTED LED ARRAY AND METHOD OF FABRICATION" filed May 9, 1994, with Ser. No. 08/240,055, and assigned to the same assignee.

Thus, various examples of integrated circuits embodying the present invention have been disclosed. The disclosed examples result in a substantial reduction in the column related external connection pads leading to off-chip drive circuits and the like and substantially reduced dimensions for chips carrying the light emitting diode arrays as well as the off chip drive circuits. Further, the fabrication of the chips carrying the light emitting diode arrays is not substantially increased in complexity, since most of the interconnecting components are formed with the light emitting diode array. Therefore, the cost is reduced and the reliability is improved. Further, because of the substantial reduction in size and cost, the resulting displays can be easily incorporated into portable electronic devices.

Throughout this description references to rows and columns are made for simplicity of the disclosure but it will be understood by those skilled in the art that these terms are completely interchangeable since rows and columns of a matrix generally depend upon a physical orientation and are changed, for example, by simply rotating the device 90o. Further, while specific sequences of steps have been disclosed and claimed, it will be understood by those skilled in the art that many of the steps are interchangeable, and the exact sequence utilized depends upon the specific methods applied, including chemicals, temperatures, etc. Further, it should be understood that neither the sequence disclosed nor claimed is intended to in any way limit the present invention to a specific sequence of steps.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. An integrated circuit comprising:

a substrate;

an addressable array of semiconductor devices formed on the substrate, each device having two terminals with all of the devices being connected in rows and columns, a column decoder formed on the substrate and including a plurality of switching circuits equal in number to the number of columns in the array, each of the columns having a different one of the plurality of switching circuits connected thereto for activating the column upon activation of the switching circuit, a plurality of address lines formed on the substrate and each address line including an external connection pad, and a plurality of sets of diodes formed on the substrate and connected to the address lines and the switching circuits so that each set of diodes has a unique code produced by a combination of diodes in that set and the address lines to which the diodes in that set are connected.

2. An electro-optic integrated circuit comprising:

a substrate;

an array of light emitting devices formed on the substrate and positioned in rows and columns, each device including first and second control electrodes with the first electrode of each device in each of the columns connected to the first electrode of every other device in the same column and the second electrode of each device in each of the rows connected to the second electrode of every other device in the same row; and a column decoder formed on the substrate and including a plurality of switching circuits equal in number to the number of columns in the array, each of the columns having all of the first electrodes in that column connected to a different one of the plurality of switching circuits, a plurality of address lines formed on the substrate and each address line including an external connection pad, and a plurality of sets of diodes formed on the substrate with the number of sets being equal to the number of columns in the array and the number of diodes in each set equaling from one to the number of address lines, each diode having first and second terminals and the first terminals of each diode in each set being connected together and to a different one of the plurality of switching circuits, the second terminal of each diode in a set being connected to a different address line so that the combination of diodes in each set produces a unique code for each switching circuit.

3. An electro-optic integrated circuit as claimed in claim 2 wherein the array of light emitting devices include an array of light emitting diodes.

4. An electro-optic integrated circuit as claimed in claim 2 wherein the plurality of switching circuits each include a depletion mode field effect transistor connected in series with all of the first electrodes of the devices in the connected column.

5. An electro-optic integrated circuit as claimed in claim 4 wherein the plurality of switching circuits each further include a current source connected to a gate of the field effect transistor.

6. An electro-optic integrated circuit as claimed in claim 5 wherein the first terminals of each diode in each set are connected to the current source in the connected different one of the plurality of switching circuits.

7. An electro-optic integrated circuit as claimed in claim 4 wherein the substrate includes gallium arsenide.

8. An electro-optic integrated circuit as claimed in claim 7 wherein the field effect transistor is a gallium arsenide metal semiconductor field effect transistor.

9. An electro-optic integrated circuit as claimed in claim 8 wherein the array of light emitting devices include indium/gallium/aluminum/phosphide diodes.

10. An electro-optic integrated circuit as claimed in claim 2 wherein the array of light emitting devices is formed in a central portion of the substrate with the address lines extending therebetween and the plurality of switching circuits and plurality of sets of diodes are positioned adjacent a periphery of the substrate.

11. An electro-optic integrated circuit as claimed in claim 2 wherein the array of light emitting devices includes a first carrier confinement layer supported on the substrate, an active layer positioned on the first carrier confinement layer and a second carrier confinement layer positioned on the active layer, the second carrier confinement layer, the active layer and the first carrier confinement layer being etched to form a plurality of mesas positioned in rows and columns defining a plurality of light emitting diodes.

12. An electro-optic integrated circuit as claimed in claim 2 wherein the array of light emitting devices includes a first carrier confinement layer supported on the substrate, an active layer positioned on the first carrier confinement layer and a second carrier confinement layer positioned on the active layer, and impurities implanted in the second carrier confinement layer, the active layer and the first carrier confinement layer to form a plurality of light emitting diodes positioned in rows and columns.

* * * * *